United States Patent
Bhanot et al.

(10) Patent No.: US 7,313,582 B2
(45) Date of Patent: Dec. 25, 2007

(54) ARITHMETIC FUNCTIONS IN TORUS AND TREE NETWORKS

(75) Inventors: Gyan Bhanot, Princeton, NJ (US); Matthias A. Blumrich, Ridgefield, CT (US); Dong Chen, Croton On Hudson, NY (US); Alan G. Gara, Mount Kisco, NY (US); Mark E. Giampapa, Irvington, NY (US); Philip Heidelberger, Cortlandt Manor, NY (US); Burkhard D. Steinmacher-Burow, Mount Kisco, NY (US); Pavlos M. Vranas, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 736 days.

(21) Appl. No.: 10/468,991

(22) PCT Filed: Feb. 25, 2002

(86) PCT No.: PCT/US02/05618

§ 371 (c)(1),
(2), (4) Date: Aug. 22, 2003

(87) PCT Pub. No.: WO02/069177

PCT Pub. Date: Sep. 6, 2002

(65) Prior Publication Data

US 2004/0073590 A1  Apr. 15, 2004

Related U.S. Application Data

(60) Provisional application No. 60/271,124, filed on Feb. 24, 2001.

(51) Int. Cl.
*G06F 7/38* (2006.01)
(52) U.S. Cl. .................................................. 708/490
(58) Field of Classification Search ................ 708/490, 708/534, 200–211; 712/11, 20
See application file for complete search history.

(56) References Cited

U.S. PATENT DOCUMENTS 5,471,580 A * 11/1995 Fujiwara et al. ............ 709/249

(Continued)

OTHER PUBLICATIONS

Network decontamination with local immunization Fabrizio, L.; Pagli, L.; Santoro, N.; Parallel and Distributed Processing Symposium, 2006. IPDPS 2006. 20th International Apr. 25-29, 2006 p. 8 pp. Digital Object Identifier 10.1109/IPDPS.2006.1639553.*

(Continued)

*Primary Examiner*—Michael B. Holmes
(74) *Attorney, Agent, or Firm*—Scully, Scott, Murphy & Presser, P.C.; Daniel P. Morris, Esq.

(57) ABSTRACT

Methods and systems for performing arithmetic functions. In accordance with a first aspect of the invention, methods and apparatus are provided, working in conjunction of software algorithms and hardware implementation of class network routing, to achieve a very significant reduction in the time required for global arithmetic operation on the torus. Therefore, it leads to greater scalability of applications running on large parallel machines. The invention involves three steps in improving the efficiency and accuracy of global operations: (1) Ensuring, when necessary, that all the nodes do the global operation on the data in the same order and so obtain a unique answer, independent of roundoff error; (2) Using the topology of the torus to minimize the number of hops and the bidirectional capabilities of the network to reduce the number of time steps in the data transfer operation to an absolute minimum; and (3) Using class function routing to reduce latency in the data transfer. With the method of this invention, every single element is injected into the network only once and it will be stored and forwarded without any further software overhead. In accordance with a second aspect of the invention, methods and systems are provided to efficiently implement global arithmetic operations on a network that supports the global combining operations. The latency of doing such global operations are greatly reduced by using these methods.

49 Claims, 5 Drawing Sheets

U.S. PATENT DOCUMENTS

| | | | | |
|---|---|---|---|---|
| 5,590,345 | A | * | 12/1996 | Barker et al. .................. 712/11 |
| 5,611,070 | A | * | 3/1997 | Heidelberger et al. ....... 711/133 |
| 5,634,096 | A | * | 5/1997 | Baylor et al. ................... 714/6 |
| 5,809,292 | A | * | 9/1998 | Wilkinson et al. .......... 712/222 |
| 6,205,532 | B1 | * | 3/2001 | Carvey et al. .................. 712/1 |
| 6,219,762 | B1 | * | 4/2001 | Hasegawa et al. .......... 711/151 |
| 6,279,092 | B1 | * | 8/2001 | Franaszek et al. .......... 711/170 |
| 6,434,675 | B2 | * | 8/2002 | Hasegawa et al. .......... 711/151 |
| 6,539,460 | B2 | * | 3/2003 | Castelli et al. .............. 711/154 |
| 6,606,656 | B2 | * | 8/2003 | Carvey et al. .............. 709/220 |
| 6,622,233 | B1 | * | 9/2003 | Gilson ......................... 712/11 |
| 6,714,552 | B1 | * | 3/2004 | Cotter ........................ 370/406 |
| 6,810,495 | B2 | * | 10/2004 | Castelli et al. ................ 714/47 |
| 6,895,416 | B2 | * | 5/2005 | Gara et al. ................... 707/204 |
| 6,976,064 | B2 | * | 12/2005 | Carvey et al. .............. 709/220 |
| 7,024,512 | B1 | * | 4/2006 | Franaszek et al. .......... 711/100 |
| 7,039,769 | B2 | * | 5/2006 | Castelli et al. .............. 711/147 |
| 7,051,185 | B2 | * | 5/2006 | Gilson ......................... 712/11 |
| 7,149,920 | B2 | * | 12/2006 | Blumrich et al. .............. 714/4 |
| 7,174,434 | B2 | * | 2/2007 | Blumrich et al. ........... 711/152 |
| 7,185,226 | B2 | * | 2/2007 | Chen et al. ................... 714/13 |
| 7,210,088 | B2 | * | 4/2007 | Chen et al. ................. 714/746 |

OTHER PUBLICATIONS

Polymorphic-torus architecture for computer vision Li, H.; Maresca, M.; Pattern Analysis and Machine Intelligence, IEEE Transactions on Vol. 11, Issue 3, Mar. 1989 pp. 233-243 Digital Object Identifier 10.1109/34.21792.*

A unified formulation of honeycomb and diamond networks Parhami, B.; Ding-Ming Kwai; Parallel and Distributed Systems, IEEE Transactions on Vol. 12, Issue 1, Jan. 2001 pp. 74-80 Digital Object Identifier 10.1109/71.899940.*

Efficient mapping algorithm of multilayer neural network on torus architecture Ayoubi, R.A.; Bayoumi, M.A.; Parallel and Distributed Systems, IEEE Transactions on Vol. 14, Issue 9, Sep. 2003 pp. 932-943 Digital Object Identifier 10-1109/TPDS.2003.1233715.*

A Scalable Distributed Parallel Breadth-First Search Algorithm on BlueGene/L Yoo, A.; Chow, E.; Henderson, K.; McLendon, W.; Hendrickson, B.; Catalyurek, U.; Supercomputing, 2005. Proceedings of the ACM/IEEE SC 2005 Conference Nov. 12-18, 2005 pp. 25-25 Digital Object Identifier 10.1109/SC.2005.4.*

Scalable distributed architecture of the terabit router Fan Li-Jun; Quan Cheng-bin; Luan Gui-Xing; Asian Green Electronics, 2004. AGEC. Proceedings of 2004 International IEEE Conference on the 2004 pp. 186-189 Digital Object Identifier 10.1109/AGEC.2004.1290899.*

A peer-to-peer network based on multi-mesh architecture Murthy, S.; Sen, A.; Global Telecommunications Conference, 2003. GLOBECOM '03. IEEE Vol. 7, Dec. 1-5, 2003 pp. 3840-3844 Vol. 7 Digital Object Identifier 10.1109/GLOBECOM.2003.1258950.*

Scalable distributed architecture of the terabit router Fan Li-Jun; Quan Cheng-bin; Luan Gui-Xing; Parallel and Distributed Computing, Applications and Technologies, 2003. PDCAT'2003. Proceedings of the Fourth International Conference on Aug. 27-29, 2003 pp. 472-475.*

A communication model based on an n-dimensional torus architecture using deadlock-free wormhole routing Holzenspies, P.; Schepers, E.; Bach, W.; Jonker, M.; Sikkes, B.; Smit, G.; Havinga, P.; Digital System Design, 2003. Proceedings. Euromicro Symposium on Sep. 1-6, 2003 pp. 166-172 Digital Object Identifier 10.1109/DSD.2003.1231920.*

The P-Mesh-a commodity-based scalable network architecture for clusters Nitzberg, B.; Kuszmaul, C.; Stockdale, I.; Becker, J.; Jiang, J.; Wong, P.; System Sciences, 1999, HICSS-32. Proceedings of the 32nd Annual Hawaii International Conference on Vol. Track8, Jan. 5-8, 1999 pp. 10 pp. Digital Object Identifier 10.1109/HICSS.1999.773070.*

Data level parallel processing for object recognition on Recursive Torus Architecture Matsuyama, T.; Asada, N.; Aoyama, M.; Kamashita, A.; Asazu, H.; Yamamoto, H.; Ogawa, K.; Computer Architectures for Machine Perception, 1995. Proceedings. CAMP '95 Sep. 18-20, 1995 pp. 90-97 Digital Object Identifier 10.1109/CAMP.1995.521023.*

Connected component labeling on polymorphic torus architecture Maresca, M.; Li, H.; Lavin, M.; Computer Vision and Pattern Recognition, 1988. Proceedings CVPR.'88., Computer Society Conference on Jun. 5-9, 1988 pp. 951-956 Digital Object Identifier 10.1109/CVPR.1988.196347.*

Parallel image analysis on recursive Torus architecture Matsuyama, T.; Asada, N.; Aoyama, M.; Computer Architectures for Machine Perception, 1993. Proceedings Dec. 15-17, 1993 pp. 202-214 Digital Object Identifier 10.1109/CAMP.1993.622474.*

Exploiting multiple degrees of BP parallelism on the highly parallel computer AP1000 Torresen, J.; Mori, S.; Nakashima, H.; Tomita, S.; Landsverk, O.; Artificial Neural Networks, 1995., Fourth International Conference on Jun. 26-28, 1995 pp. 483-488.*

* cited by examiner

1. Ensuring that all nodes do the global operation in the same order.
2. Minimizing the number of steps in the data transfer.
3. Reducing the latency using class function routing.

Global Sum

Figure 5

Global All Gather

ARITHMETIC FUNCTIONS IN TORUS AND TREE NETWORKS

CROSS REFERENCE TO RELATED APPLICATIONS

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending U.S Patent Applications filed on even date herewith, the entire contents and disclosure of each of which is expressly incorporated by reference herein as if fully set forth herein. U.S. patent application Ser. No. 10/468,999, filed Aug. 22, 2003, for "Class Networking Routing"; U.S. patent application Ser. No. 10/469,000, filed Aug. 22, 2003, for "A Global Tree Network for Computing Structures"; U.S. patant application Ser. No. 10/468,997, filed Aug. 22, 2003, for 'Global Interrupt and Barrier Networks"; U.S. patent application Ser. No. 10/469,001, filed Aug. 22, 2003, for 'Optimized Scalable Network Switch"; U.S. patent application Ser. No. 10/468,991, filed Aug. 22, 2003, for "Arithmetic Functions in Torus and Tree Networks'; U.S. patent application Ser. No. 10/468,992, filed Aug. 22, 2003, for 'Data Capture Technique for High Speed Signaling"; U.S. patent application Ser. No. 10/468,995, filed Aug. 22, 2003, for 'Managing Coherence Via Put/Get Windows'; U.S. patent application Ser. No. 10/468,994, filed Aug. 22, 2003, for "Low Latency Memory Access And Synchronization"; U.S. patent application Ser. No. 10/468,990, filed Aug. 22, 2003, for 'Twin-Tailed Fail-Over for Fileservers Maintaining Full Performance in the Presence of Failure"; U.S. patent application Ser. No. 10/468,996, filed Aug. 22, 2003, for "Fault Isolation Through No-Overhead Link Level Checksums'; U.S. patent application Ser. No. 14/469,003, filed Aug. 22, 2003, for "Ethernet Addressing Via Physical Location for Massively Parallel Systems"; U.S. patent application Ser. No. 10/469,002, filed Aug. 22, 2003, for "Fault Tolerance in a Supercomputer Through Dynamic Repartitioning"; U.S. patent application Ser. No. 10/258,515, filed Aug. 22, 2003, for "Checkpointing Filesystem"; U.S. patent application Ser. No. 10/468,998, filed Aug. 22, 2003, for "Efficient Implementation of Multidimensional Fast Fourier Transform on a Distributed-Memory Parallel Multi-Node Computer"; U.S. patent application Ser. No. 10/468,993, filed Aug. 22, 2003, for "A Novel Massively Parallel Supercomputer"; and U.S. patent application Ser. No. 10/083,270, filed Aug. 22, 2003, for "Smart Fan Modules and System".

This invention was made with Government support under subcontract number B517552 under prime contract number W-7405-ENG-48 awarded by the Department of Energy. The Government has certain rights in this invention.

BACKGROUND ART

Provisional patent application No. 60/271,124, titled "A Novel Massively Parallel SuperComputer" describes a computer comprised of many computing nodes and a smaller number of I/O nodes. These nodes are connected by several networks. In particular, these nodes are interconnected by both a torus network and by a dual functional tree network. This torus network may be used in a number of ways to improve the efficiency of the computer.

To elaborate, on a machine which has a large enough number of nodes and with a network that has the connectivity of an M-dimensional torus, the usual way to do a global operation is by the means of shift and operate. For example, to do a global sum (MPI_SUM) over all nodes, after each computer node has done its own local partial sum, each node first sends the local sum to its plus neighbor along one dimension and then adds the number it itself received from its neighbor to its own sum. Second, it passes the number it received from its minus neighbor to its plus neighbor, and again adds the number it receives to its own sum. Repeating the second step (N−1) times (where N is the number of nodes along this one dimension) followed by repeating the whole sequence over all dimensions one at a time, yields the desired results on all nodes. However, for floating point numbers, because the order of the floating point sums performed at each node is different, each node will end up with a slightly different result because of roundoff effects due to the fact that the order of the floating point sums performed at each node is different. This will cause a problem if some global decision is to be made which depends on the value of the global sum. In many cases, this problem is avoided by picking a special node which will first gather data from all the other nodes, do the whole computation and then broadcast the sum to all nodes. However, when the number of nodes is sufficiently large, this method is slower than the shift and operate method.

In addition, as indicated above, in the computer disclosed in provisional patent application No. 60/271,124, the nodes are also connected by a dual-functional tree network that supports integer combining operations, such as integer sums and integer maximums (max) and minimums (min). The existence of a global combining network opens up possibilities to efficiently implement global arithmetic operations over this network. For example, adding up floating point numbers from each of the computing nodes, and broadcasting the sum to all participating nodes. On a regular parallel supercomputer, these kinds of operations are usually done over the network that carries the normal message-passing traffic. There is usually high latency associated with such kinds of global operations.

SUMMARY OF THE INVENTION

An object of this invention is to improve procedures for computing global values for global operations on a distributed parallel computer.

Another object of the present invention is to compute a unique global value for a global operation using the shift and operate method in a highly efficient way on distributed parallel M-torus architectures with a large number of nodes.

A further object of the invention is to provide a method and apparatus, working in conjunction with software algorithms and hardware implementations of class network routing, to achieve a very significant reduction in the time required for global arithmetic operations on a torus architecture.

Another object of this invention is to efficiently implement global arithmetic operations on a network that supports global combining operations.

A further objective of the invention is to implement global arithmetic operations to generate binary reproducible results.

An object of the present invention is to provide an improved procedure for conducting a global sum operation.

A further object of the invention is to provide an improved procedure for conducting a global all gather operation.

These and other objectives are attained with the below described methods and systems for performing arithmetic functions. In accordance with a first aspect of the invention, methods and apparatus are provided, working in conjunction of software algorithms and hardware implementation of class network routing, to achieve a very significant reduction in the time required for global arithmetic operations on the torus. This leads to greater scalability of applications running on large parallel machines. The invention involves three steps for improving the efficiency, accuracy and exact reproducibility of global operations:

1. Ensuring, when necessary, that all the nodes do the global operation on the data in the same order and so obtain a unique answer, independent of roundoff error.
2. Using the topology of the torus to minimize the number of hops and the bidirectional capabilities of the network to reduce the number of time steps in the data transfer operation to an absolute minimum.
3. Using class function routing described in U.S. patent application Ser. No. 10/468,999, to reduce latency in the data transfer. With the method of is invention, every single element is injected into the network only once and it will b stored and forwarded without any further software overhead.

In accordance with a second aspect of the invention, methods and systems are provided to efficiently implement global arithmetic operations on a network that supports the global combining operations. The latency of doing such global operations are greatly reduced by using these methods. In particular, with a combing tree network that supports integer maximum MAX, addition SUM, and bitwise AND, OR, and XOR, one can implement virtually all predefined global reduce operations in MPI (Message-Passing Interface Standard): MPI_SUM, MPI_MAX, MPI_MIN, MPI_LAND, MPI_BAND, MPI_LOR, MPI_BOR, MPI_LXOR, MPI_BXOR, MPI_MAXLOC, AND MPI_MINLOC plus MPI_ALLGATHER over this network. The implementations are easy and efficient, demonstrating the great flexibility and efficiency a combining tree network brings to a large scale parallel supercomputer.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The present invention relates to performing arithmetic functions in a computer, and one suitable computer is disclosed in provisional patent application No. 60/271,124.

Figure 1:
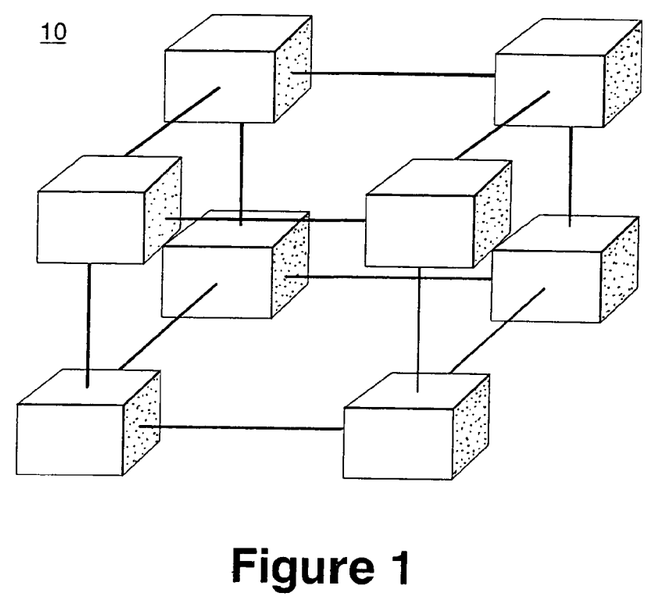
FIG. 1 schematically represents a torus network that connects the nodes of a computer. The wrapped network connections are not shown.
Figure 2:
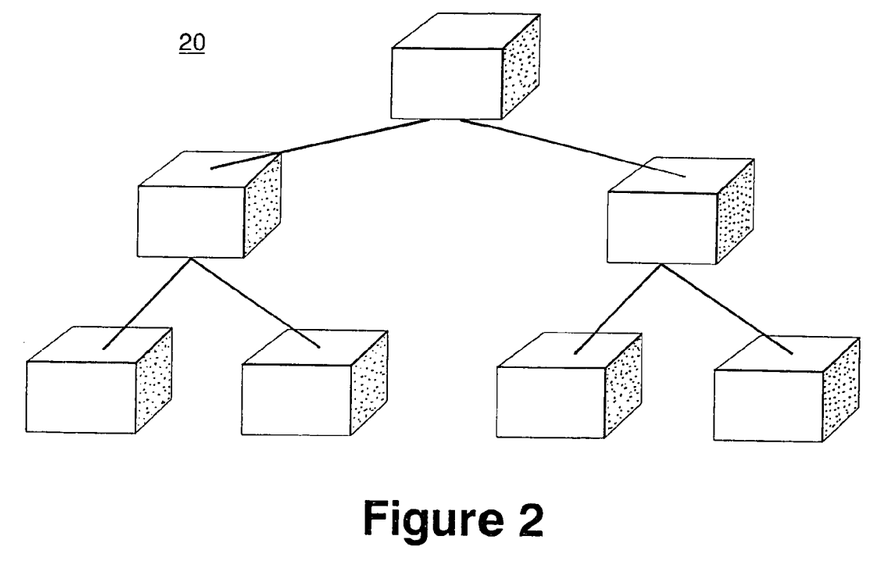
FIG. 2 schematically represents a tree network that connects the nodes of a computer.

This computer is comprised of many computing nodes and a smaller number of I/O nodes; and the nodes of this computer are interconnected by both a torus network, schematically represented at 10 in FIG. 1, and a dual functional tree network, schematically represented at 20 in FIG. 2.

Figure 3:
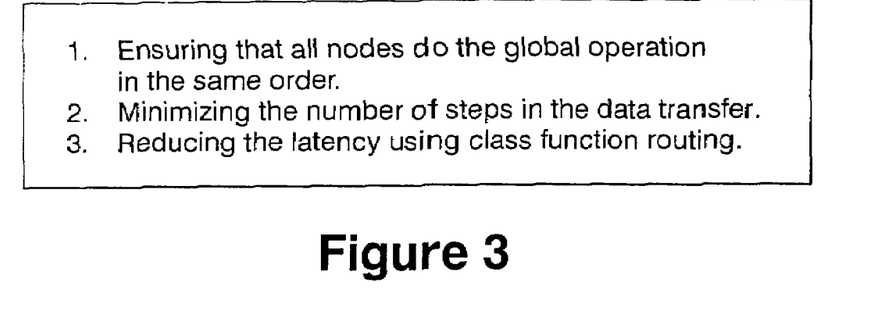
FIG. 3 illustrates a procedure for performing a global sum on a one-dimensional torus.

More specifically, one aspect of the present invention provides a method and apparatus working in conjunction with software algorithms and hardware implementation of class network routing, to achieve a very significant reduction in the time required for global arithmetic operation on the torus architecture. Therefore, it leads to greater scalability of applications running on large parallel machines. As illustrated in FIG. 3, the invention involves three steps in improving the efficiency and accuracy of global operations:

1. Ensuring, when necessary, that all the nodes do the global operation on the data in the same order, and so obtain a unique answer, independent of roundoff error.
2. Using the topology of the torus to minimize the number of hops and the bidirectional capabilities of the network to reduce the number of time steps in the data transfer operation to an absolute minimum.
3. Using class function routing to reduce latency in the data transfer. With the preferred method of this invention, every single element is injected into the network only once and it will be stored and forwarded without any further software overhead.

Each of these steps is discussed below in detail.

1. Ensuring that all nodes to the global operation (eg. MPI_SUM) in the same order:

When doing the one-dimensional shift and addition of the local partial sums, instead of adding numbers when they come in, each node will keep the N–1 numbers received for each direction. The global operation is performed on the numbers after they have all been received so that the operation is done in a fixed order and results in a unique result on all nodes.

Figure 4:
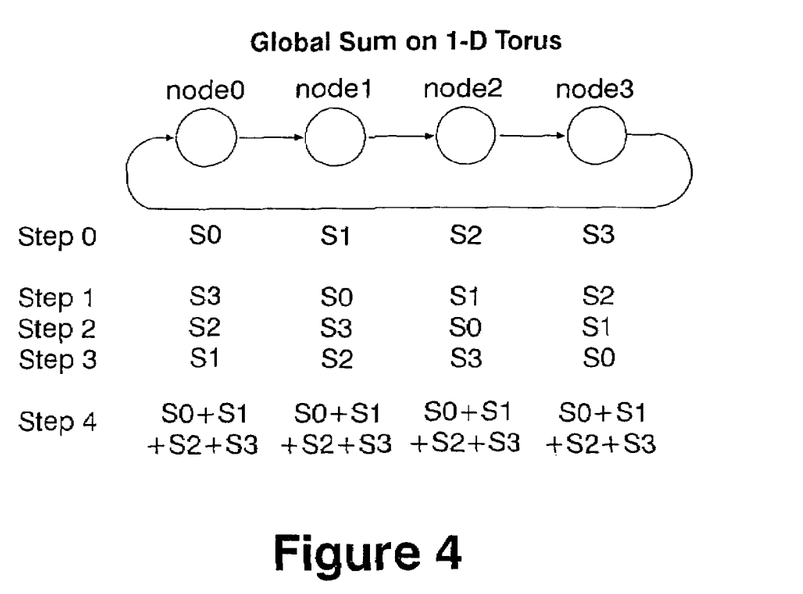
FIG. 4 is a table identifying steps that can be used to improve the efficiency of global arithmetic operations on a torus architecture.

For example, as illustrated in FIG. 4, if each node adds numbers as they are received, the sums computed would be S0+S3+S2+S1 on node 0, S1+S0+S3+S2 node 1, S2+S1+S0+S3 on node 3, and S3+S2+S1+S0 on node 4. Ther roundoff differences between these sums. However, if the numbers that every node receives are kept in memory, than all the nodes could do the sum in the same order to obtain S0+S1+S2+S3 and there would be no roundoff difference.

This is repeated for all the other dimensions. At the end, all the nodes will have the same number and the final broadcast is unnecessary.

2. Minimizing the number of steps in the data transfer on an M-torus architecture:

On any machine where the network links between two neighboring nodes are bidirectional, we can send data in both directions in each of the steps. This will mean that the total distance each data element has to travel on the network is reduced by a factor of two. This reduces the time for doing global arithmetic on the torus also by almost a factor of two.

3. Reducing the latency using class function routing:

Additional performance gains can be achieved by including a store and forward class network routing operation in the network hardware, thereby eliminating the software overhead of extracting and injecting the same data element multiple times into the network. When implementing global arithmetic operations on a network capable of class routing, steps 1 to 3 illustrated in FIG. 4 will simply become a single network step; i.e., each node will need to inject a number only once and every other node will automatically forward this number along to all the other nodes that need it, while keeping a copy for its own use. This will greatly reduce the latency of the global operation. Instead of paying software overhead every hop on the torus, one will pay only a single overhead cost per dimension of the machine. For example, on the computer system disclosed in Provisional Application No. 60/271,124, we estimate that there will be an improvement of at least a factor of five when the CPU is running in single user mode and more than a factor of ten in multi-user mode.

With the three improvement steps discussed above, one can achieve at least a factor of ten improvement for global arithmetic operations on distributed parallel architectures and also greatly improve the scalabilty of applications on a large parallel machine.

In addition, as previously mentioned, in the computer system disclosed in the above-identified provisional application, the nodes are also connected by a tree network that supports data combining operations, such as integer sums and integer maximums and minimums, bitwise AND, OR and XORs. In addition, the tree network will automatically broadcast the final combined result to all participating nodes. With a computing network supporting global combining operations, many of the global communication patterns can be efficiently supported by this network. By far the simplest requirement for the combining network hardware is to support unsigned integer add and unsigned integer maximum up to certain precision. For example, the supercomputer disclosed in the above-identified provisional patent application will support at least 32 bit, 64 bit and 128 bit unsigned integer sums or maximums, plus a very long precision sum or maximum up to the 2048 bit packet size. The combining functions in the network hardware provide great flexibility in implementing high performance global arithmetic functions. A number of examples of these implementations are presented below.

1. Global Sum of Signed Integers

Figure 5:
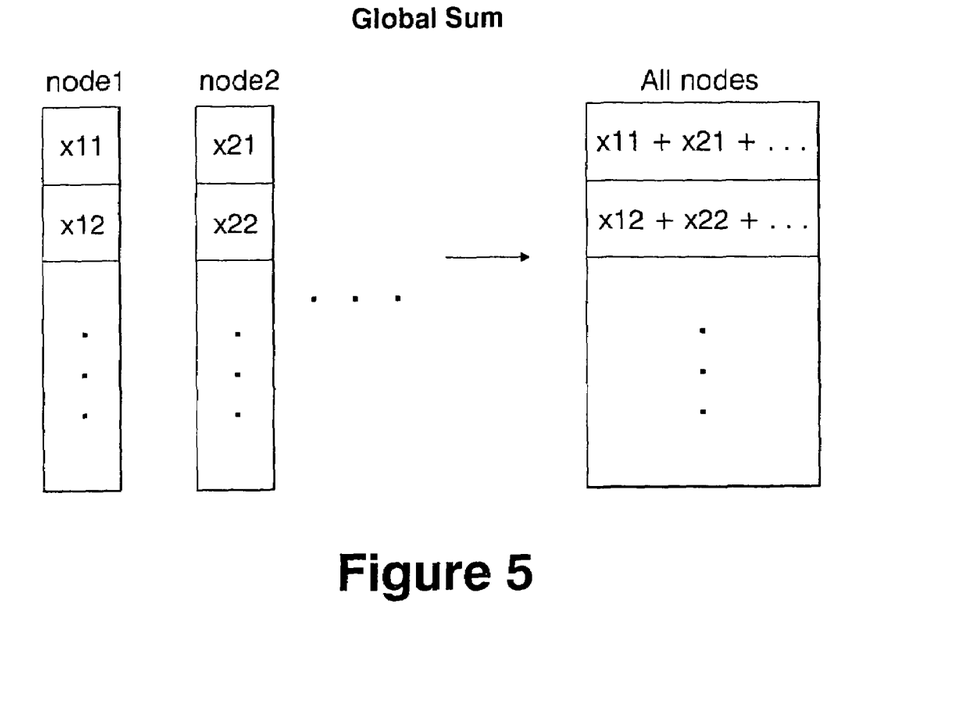
FIG. 5 illustrates the operation of global sum on a dual-functional tree network.

FIG. 5 shows the operation of global sum. Each participating node has an equal size array of numbers with the same number of array elements. The result of the global sum operation is that each node will have the sum of the corresponding elements of arrays from all nodes. This relates to the MPI_SUM function in the MPI (Message Passing Interface) standard.

It is usually necessary to use a higher precision in the network compared to each local number to maintain the precision of the final result. Let N be the number of nodes participating in the sum, M be the largest absolute value of the integer numbers to be summed, and $2^P$ be a large positive integer number greater than M. To implement signed integer sum in a network that supports the unsigned operation, we only need to (1) Add the large positive integer $2^P$ to all the numbers to be summed so that they now become non-negative.
(2) Do the unsigned integer sum over the network.
(3) Subtract $(N*2^P)$ from the result.

P is chosen so that $2^P > M$, and $(N*2^{(P+1)})$ will not overflow in the combining network.

2. Global Max and Min of Signed Integers

These operations are very similar to the global sum discussed above, except that the final result is not the sum of the corresponding elements but the maximum or the minimum one. They relate to MPI_MAX and MPI_MIN functions in the MPI standard with the integer inputs. The implementation of global max is very similar to the implementations of the global sum, as discussed above.

(1) Add a large positive integer $2^P$ to all numbers to make them non-negative.
(2) Do the unsigned global max over the network.
(3) Subtract $2^P$ from the result.

To do a global min, just negate all the numbers and do a global max.

3. Global Sum of Floating Point Numbers:

The operation of the global sum of floating point numbers is very similar to the earlier discussed integer sums except that now the inputs are floating point numbers. For simplicity, we will demonstrate summing of one number from each node. To do an array sum, just repeat the steps.

The basic idea is to do two round-trips on the combining network.

(1) Find the integer maximum of the exponent of all numbers, Emax, using the steps outlined in the discussion of the Global max.
(2) Each node will then normalize its local number and convert it to an integer. Let the local number on node "i" be $X\_i$, whose exponent is $E\_i$. Using the notation defined in the description of the Global sum, this conversion corresponds to the calculation, $$A\_i = 2^P + 2^{[P-(E\max - E) - 1]} * X\_i, \quad [\text{Eq. 1}]$$

Where $A\_i$ is an unsigned integer. A global unsigned integer sum can then be preformed on the network using the combining hardware. Once the final sum A has arrived at each node, the true sum S can be obtained on each node locally by calculating $$S = (A - N*2^P)/2^{(P-1)}.$$

Again, P is chosen so that $N*2^{(P+1)}$ will not overflow in the combining network.

It should be noted that the step done in equation (1) above is achieved with the best possible precision by using a microprocessor's floating point unit to convert negative numbers to positive and then by using its integer unit to do proper shifting One important feature of this floating point sum algorithm is that because the actual sum is done through an integer sum, there is no dependence on how the order of the sum is carried out. Each participating node will get the exact same number after the global sum. No additional broadcast from a special node is necessary, which is usually the case when the floating point global sum is implemented through the normal message passing network.

Those skilled in the art will recognize that even of the network hardware supports only unsigned integer sums, when integers are represented in 2's complementary format, correct sums will be obtained as long as no overflow occurs on any final and intermediate results and the carry bit of the sum over any two numbers are dropped by the hardware. The simplification of the operational steps to the global integer and floating point sums comes within the scope of the invention, as well as when the network hardware directly supports signed integer sums with correct overflow handling.

For example, when the hardware only supports unsigned integer sums and drops all carry bits from unsigned integer overflow, such as implemented on the supercomputer, disclosed in provisional patent applications No. 60/271,124 a simplified signed integer sum steps could be:
(1) sign extend each integer to a higher precision to ensure no overflow of any results would occur; i.e., pad 0 to all the extended high order bits for positive integers and zero, pad 1, to all the extended bit for negative integers.
(2) do the sum over the network. The final result will have the correct sign.

The above can also be applied to the summing step of floating point sums.

With a similar modification from the description of the Global Sum of integers to the description of the Global max, floating point max and min can also easily be obtained.

There is also a special case for floating point max of non-negative numbers, the operation can be accomplished in one round trip instead of two. For numbers using the IEEE 754 Standard for Floating Point Binary Arithmetic format, as in most of the modern microprocessors, no additional local operations are required. With proper byte ordering, each node can just put the numbers on the combining network. For other floating point formats, like those used in some Digital Signal Processors, some local manipulation of the exponent field may be required. The same single roundtrip can also be achieved for the min of negative numbers by doing a global max on their absolute values.

4. Global All Gather Operation Using Integer Global Sum

Figure 6:
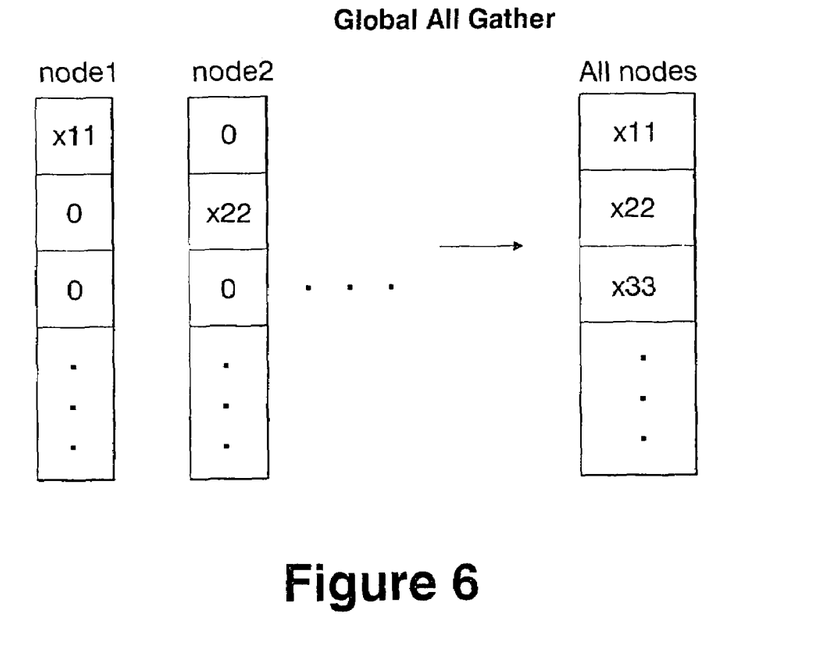
FIG. 6 illustrates the operation of global all gathering on a dual-functional tree network.

The global all gather operation is illustrated In FIG. 6. Each node contributes one or more numbers. The final result is that these number are put into an array with their location corresponding to where they came from. For example, numbers from node 1 appear first in the final array, followed by numbers from node 2, . . . , etc. This operation corresponds to the MPI_ALLGATHER function in the MPI standard.

This function can be easily implemented in a one pass operation on a combining network supporting integer sums. Using the fact that adding zero to a number yields the same number, each node simply needs to assemble an array whose size equals the final array, and then it will put its numbers in the corresponding place and put zero in all other places corresponding to numbers from all other nodes. After an integer sum of arrays from all nodes over the combining network, each node will have the final array with all the numbers sorted into their places.

5. Global Min_Loc and Max_Loc, Using Integer Global Max

These functions correspond to MPI_MINLOC and MPI_MAXLOC in the MPI standard. Besides finding the global minimum or maximum, an index is appended to each of the numbers so that one could find out which node has the global minimum or maximum, for example.

On a combining network that supports integer global max, these functions are straight forward to implement. We will illustrate global max_loc as an example. Let node "j", j=1, . . . , N, have number $X\_j$ and index $K\_j$. Let M be a large integer number, $M>\max(K\_j)$, the node "j" only needs put two numbers:

$X\_j$ $M-K\_j$ as a single unit onto the combining network for global integer max. At the end of the operation, each node would receive:

X

M−K

Where $X=\max(X\_j)$ is the maximum value of all $X\_j$'s, and K is the index number that corresponds to the maximum X. If there is more than one number equal to the maximum X, then K is the lowest index number.

Global min_loc can be achieved similarly by changing $X\_j$ to $P-X\_j$ in the above where P is a large positive integer number and $P>\max(X\_j)$.

The idea of appending the index number behind the number in the global max or mix operation also applies to floating pointing numbers. With steps similar to those described above in the discussion of the procedure for performing the global sum of floating point numbers.

6. Other Operations:

On the supercomputer system described in the provisional patent application No. 60/271,124, additional global bitwise AND, OR, and XOR operations are also supported on the combining network. This allows for very easy implementation of global bitwise reduction operations, such as MPI_BAND, MPI_BOR and MPI_BXOR in the MPI standard. Basically, each node just needs to put the operand for the global operation onto the network, and the global operations are handled automatically by the hardware.

In addition, logical operations MPI_LAND, MPI_LOR and MPI_LXOR can also be implemented by just using one bit in the bitwise operations.

Finally, each of the global operations also implies a global barrier operation. This is because the network will not proceed until all operands are injected into the network. Therefore, efficient MPI_BARRIER operations can also be implemented using any one of the global arithmetic operations, such as the global bitwise AND.

Figure 7:
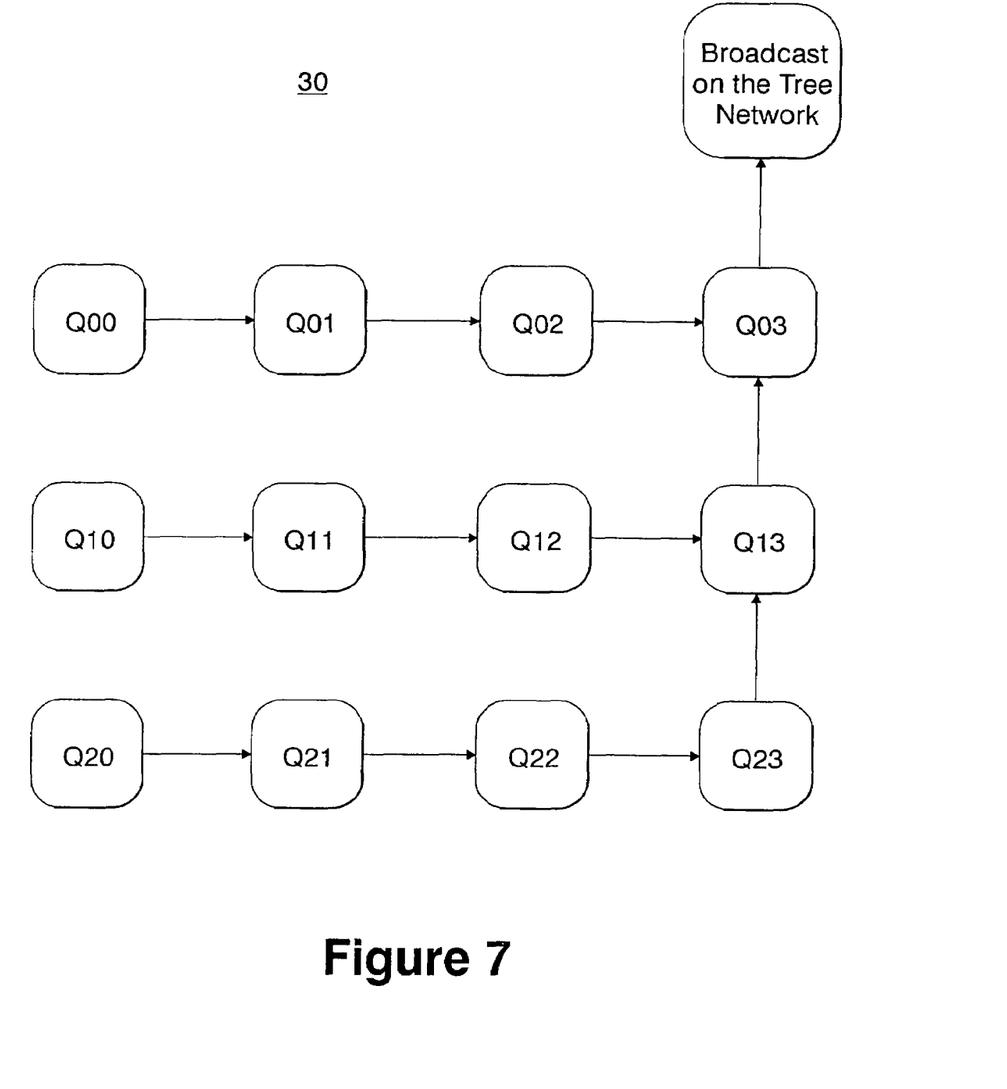
FIG. 7 illustrates a 3 by 4 torus network.

7. Operations Using Both the Torus and Tree Networks:

Depending on the relative bandwidths of the torus and tree networks, and on the overhead to do the necessary conversions between floating and fixed point representations, it may be more efficient to use both the torus and tree networks simultaneously to do global floating point reduction operations. In such a case, the torus is used to do the reduction operation, and the tree is used to broadcast the results to all nodes. Prior art for doing reductions on a torus are known. However, in prior art, the broadcast phase is also done on the torus. For example, in a 3 by 4 torus (or mesh) as illustrated at 30 in FIG. 7, reductions are done down rows, and then down columns by nodes at the ends of the rows. In particular, in a sum reduction, FIG. 7 depicts node Q20 inserting a packet and sending it to node Q21. Q21 processes this packet by adding its corresponding elements to those of the incoming packet and then sending a packet containing the sum to Q22. Q22 processes this packet by adding its corresponding elements to those of the incoming packet and then sending a packet containing the sum to Q23. These operations are repeated for each row. Node Q23 sums its local values to the corresponding values in the packet from Q22 and sends the resulting packet to Q13. Node Q13 sums its local values to those of the packets from Q12 and Q23, and sends the resulting sum to Q03. Q03 sums its local values to the corresponding values of the packet from Q13. Q03 now has the global sum. In prior art, this global sum is sent over the torus network to all the other nodes (rather than on the tree as shown in the figure). The extension to more nodes and to a higher dimensional torus is within the ability of those skilled in the art and within the scope of the present invention. For reductions over a large number of values, multiple packets are used in a pipelined fashion.

Figure 8:
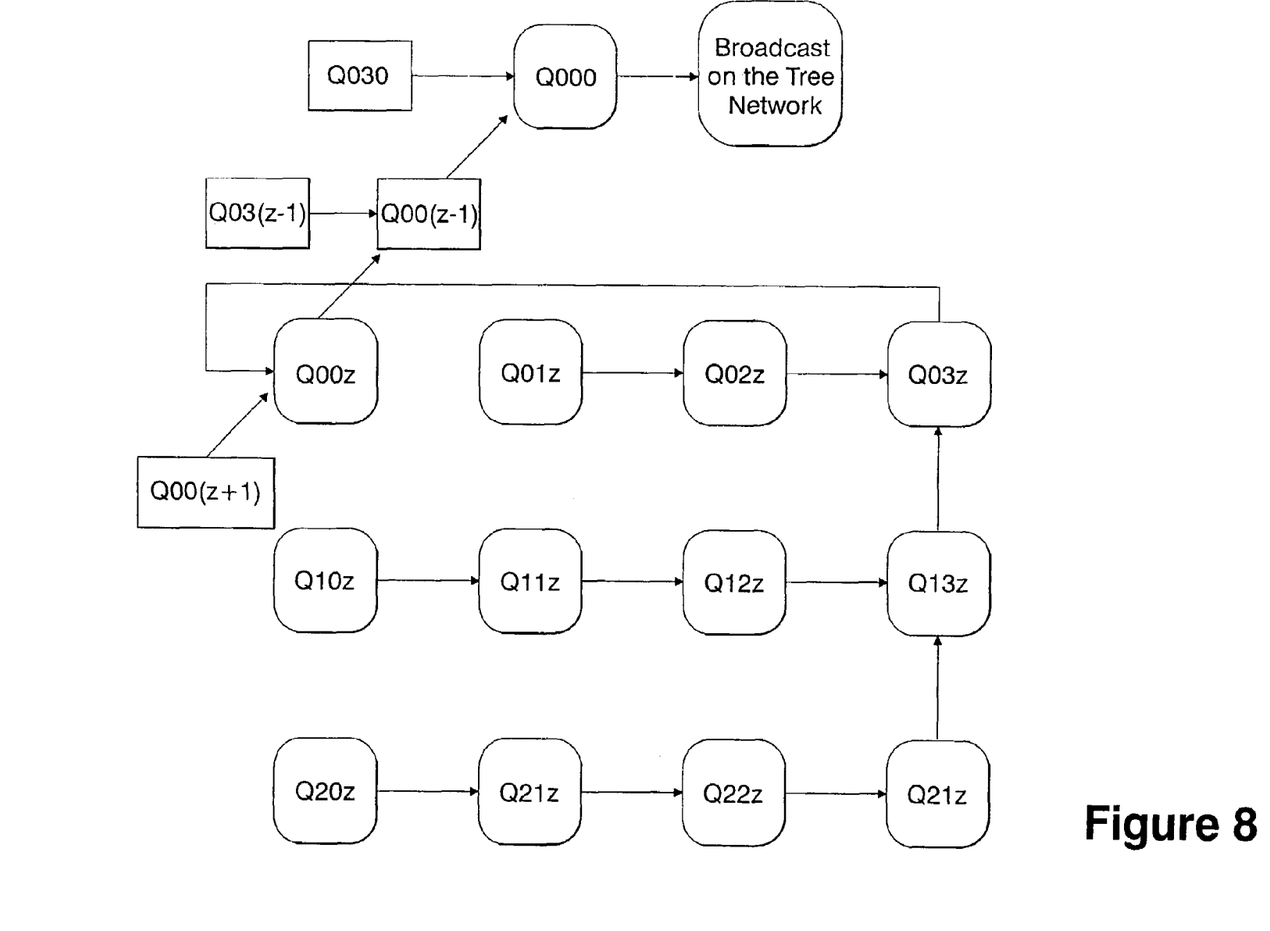
FIG. 8 illustrates a tree network for doing a final broadcast operation.

However, the final broadcast operation can be done faster and more efficiently by using the tree, rather than the torus, network. This is illustrated in FIG. 8. Performance can be optimized by having one processor handle the reduction operations on the torus and a second processor handle the reception of the packets broadcast on the tree. Performance can further be optimized by reducing the number of hops in the reduction step. For example, packets could be sent (and summed) to the middle of the rows, rather than to the end of the rows.

In a 3-dimensional torus, the straightforward extension of the above results in a single node in each z plane summing their values up the z dimension. This has the disadvantage of requiring those nodes to process three incoming packets. For example, node Q03z has to receive packets from Q02z, Q13z, and Q03(z+1). If the processor is not fast enough this will become the bottleneck in the operation. To optimize performance, we modify the communications pattern so that no node is required to process more than 2 incoming packets on the torus. This is illustrated in FIG. 8. In this Figure, node Q03z forwards its packets to node Q00z for summing down the z-dimension. In addition, node Q00z does not send its packets to node Q01z but rather receives a packet from node Q00(z+1) and sums its local values with the corresponding values of its two incoming packets. Finally, node Q000 broadcasts the final sum over the tree network.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of performing global arithmetic operations, using a shift and operate procedure, in a distributed computer system with a distributed parallel torus architecture comprising a multitude of interconnected nodes in order to obtain a final global data value, the method comprising the steps:
   selecting a group of the multitude of interconnected nodes to perform a global arithmetic operation;
   providing each of the group with the same set of data values; and
   performing the global arithmetic operation, wherein each node of the group performs the arithmetic operation on all of the data values in the same order to ensure binary reproducible results, and to obtain the final global data value.

2. The method according to claim 1, wherein the performing step includes that each node perform the global arithmetic operation only after the node is provided with all of the data values.

3. The method according to claim 2, wherein the providing step includes that each node of the group receives the data values from other nodes of the group.

4. The method according to claim 1, wherein the multitude of interconnected nodes are connected together with hi-directional links, and the providing step includes sending the data values to the nodes in two directions over said links.

5. The method according to claim 1, wherein the providing step includes that each node of the multitude of interconnecting nodes injects one of the data values into the distributed computer system only once.

6. The method according to claim 5, wherein the injecting step includes tat each node of the group of nodes forward at least one of the data values to other nodes of the group to reduce the latency of the global arithmetic operation.

7. A distributed computer system for performing global arithmetic operations, using a shift and operate procedure, the distributed computer system comprising a distributed parallel torus architecture with a multitude of interconnected nodes to obtain a final global data value, and comprising:
   means for selecting a group of the multitude of interconnected nodes;
   means for providing said group nodes with the same set of data values;
   means for performing the global arithmetic operation using the group nodes, wherein each of the group nodes performs the arithmetic operation on all of the data values to obtain the final global value; and
   means for ensuring that all of the group nodes perform said global arithmetic operation on the data values in the same order to ensure binary reproducible results.

8. The distributed computer system according to claim 7, wherein the ensuring means provides for performing the global arithmetic operation at each node only after the node is provided with all of the data values.

9. The distributed computer system according to claim 7, wherein each group node receives the data values from other nodes of the group.

10. The distributed computer system according to claim 7, wherein the nodes are connected together by bi-directional links, and the providing means sends the data values to the nodes in two directions over said links.

11. The distributed computer system according to claim 7, wherein each one of the group nodes injects one of the data values into the system only once.

12. The distributed computer system according to claim 7, wherein group nodes forward said one of the data values to other group nodes of The group to reduce the latency in the performing of the global arithmetic operation.

13. A program storage device readable by machine, tangibly embodying a program of machine-executable instructions that when executed by each machine of a plurality of machines comprising a distributed machine system, implement a global method of performing arithmetic functions, using a shift and operate procedure, to obtain a final global data value wherein the distributed machine system includes a distributed parallel torus architecture with a multitude of interconnected nodes, the method steps comprising:
   selecting a group of the multitude of the interconnected nodes to perform a global arithmetic operation;
   providing each node of the group of the nodes with the same set of data values; and
   performing the global arithmetic operation in such a way that each of the group nodes operates on all of the data values in the same order to ensure binary reproducible results and to obtain the final global data value.

14. The program storage device according to claim 13, wherein the performing step further includes that each group node perform the global arithmetic operation after the group node is provided with all of the data values.

15. The program storage device according to claim 14, wherein the providing step further includes that each group node receives the data values from other group nodes.

16. The program storage device according to claim 13, wherein the nodes of the multitude of interconnected nodes are connected together by bi-directional links, and the providing step further includes sending the data values to said nodes in two directions over said bi-directional links.

17. The program storage device according to claim 13, wherein the providing step further includes that each one of the group nodes injects one of the data values into the network only once.

18. The program storage device according to claim 17, wherein the injecting step thither includes that the group nodes, as distinguished from each one of the multitude of interconnected nodes, and forwards said one of the data values to other group nodes to reduce the latency of the global arithmetic operation.

19. A method of performing an arithmetic function in a distributed computer system having a multitude of nodes interconnected by a global free network that supports integer combining operations to obtain a final global data value, the method comprising the steps of:
providing each of a group of nodes of the multitude of nodes with first values;
processing each of the first values by each of the group of nodes according to a first defined process to obtain a respective second value from each of the first values, wherein all of the second values are integer values; and
performing a global integer combine operation, using said second values, over the network to obtain the final global value.

20. The method according to claim 19, wherein the performing step further includes performing a global unsigned integer sum over the network.

21. The method according to claim 19, wherein the performing step further includes performing a global maximum operation over the network, and using results of said global maximum operation to identify the maximum of the first values.

22. The method according to claim 19, wherein the performing step further includes performing a global maximum operation over the network, and using the results of said global maximum operation to identify the minimum of the first values.

23. A distributed computer system comprising a multitude of nodes interconnected by a global free network for performing arithmetic functions to obtain a final global data value, and is supported by integer combining operations, comprises:
a group of nodes of the multitude of interconnected nodes, wherein each of the group nodes is provided with first values;
a processor that electrically communicates with each of the group nodes to process each of the first values, according to a first defined process, and to obtain a respective second value from each of the first values, wherein all of the second values are integer values; and
means for performing a global integer combine operation, using said second values, over the network to obtain the final global data value.

24. The distributed computer system according to claim 23, wherein the means for performing executes a global unsigned integer sum over the network.

25. The distributed computer system according to claim 23, wherein the means for performing executes a global maximum operation over the network, and uses results of said global maximum operation to identify the maximum of the first values.

26. The distributed computer system according to claim 23, wherein the means for performing executes a global maximum operation over the network, and uses the results of said global maximum operation to identify the minimum of the first values.

27. A program storage device readable by machine, tangibly embodying a program of instructions executable by the machine, which instructions, when operated upon by the machine, perform method steps that support executed of a global arithmetic function, wherein said machine is one of a group of machines comprising a distributed computer system that includes a multitude of nodes interconnected by a global free network that supports integer combining operations and controls the execution of the global arithmetic function to obtain global data value, the method steps comprising:
selecting a group of nodes of the multitude of nodes that will execute the global arithmetic operation;
providing each of the group nodes with first values;
processing each of The first values by the group nodes, according to a first defined process, to obtain a respective second value from each of the first values, wherein all of the second values are integer values; and
performing a global integer combine operation, using said second values, over the network and obtain the global data value.

28. The program storage device according to claim 27, wherein the performing step further includes calculating a global unsigned integer sum over the network.

29. The program storage device according to claim 27, wherein the performing step further includes executing a global maximum operation over the network, and using results of said global maximum operation to identify the maximum of the first values.

30. The program storage device according to claim 27, wherein the performing step further includes executing a global maximum operation over the network, and using the results of said global maximum operation to identify the minimum of the first values.

31. A method of performing a global operation on a distributed computer system having a multitude of nodes interconnected by a global tree network that supports integer combining operations to obtain a global data value, the method comprising:
providing each node of the multitude of nodes with one or more numbers of any type; assembling the one or more numbers of any type into an array, the array having a given number of positions, said assembling step further including the steps of:
first loading each node's one or more of the numbers into one or more of the given number of positions of the array, and
second loading zero values into all said given number of positions of the array that were not loaded during the first loading; and
using the global tree network to sum all the numbers in the array and obtain the global data value.

32. The method according to claim 31, wherein the given number of positions of the array are arranged in a defined sequence; and wherein
the assembling step further includes establishing for each node an associated array that includes said given number of positions arranged in the defined sequence, and loading the one or more numbers of the node into one or more of the given number of positions, and loading zero values in all of the associated array's other positions.

33. A distributed computer system having a multitude of nodes interconnected by a global tree network that supports integer combining operations, for performing a global operation to obtain a global data value, the system comprising:
a group of nodes of the multitude of nodes, each of the group nodes having one or more numbers associated with that node;
means for assembling the numbers of each of the group nodes into an array, the array comprising a given number of positions, said assembling means thither including:

means for putting one or more of the numbers of each of the group nodes into one or more of the given number of positions, and means for puffing zero values into all other of the given number of positions, and means for using the global tree network to sum all the numbers put into each position in the array to obtain the global data value.

34. The system according to claim 33, wherein:
the given number of positions of the array are arranged in a defined sequence; and
the means for assembling further includes means for establishing a respective one array associated with each of the group nodes, for maintaining said given number of positions in the defined sequence, for loading the one or more numbers of each of the group nodes into one or more of the positions of the associated array, and for loading zero values in all of the other positions of the associated array.

35. A program storage device readable by machine, tangibly embodying a program of instructions executable by the machine, which instructions, when operated upon by the machine, perform method steps that support execution of global operation, wherein said machine is one of a group of machines comprising a global computer system having a multitude of nodes interconnected by a global tree network that supports integer combining operations, and controls the execution of the global operation to obtain a final global data value, the method steps comprising:

providing each node of the multitude of nodes with one or more numbers;

assembling the numbers of the nodes into an array, the array having a given number of positions, said assembling further including the steps of:

a. loading one or more of the numbers of each of the nodes into one or more of the given number of positions of the array, and loading zero values into all of the other positions of the array, and b. summing all the numbers loaded into each position in the array using the global tree network to obtain said global data value.

36. The method according to claim 35, wherein:
the given number of positions of the array are arranged in a defined sequence; and
wherein
the assembling step further includes each node establish an associated array with said given number of positions arranged in the defined sequence, and loading the node's one or more numbers into one or more of the given number of positions, and loading zero values in all other positions of the associated array.

37. A method of performing an arithmetic function globally in a distributed computer system having a multitude of nodes interconnected by a global tree network that supports integer combining operations, the method comprising the steps of:

controlling each of the interconnected nodes of global tree network to contribute a set of first values required to perform the global arithmetic function; and performing a global integer combine operation, using said first values, over the network of interconnected nodes an arithmetic function result to obtain a global data value.

38. The method according to claim 37, wherein the performing step further includes using results of the global integer combine operations to identify a characteristic of the first values.

39. A distributed computer system for performing an arithmetic function comprises a multitude of nodes interconnected by a global free network tat supports integer combining operations, the system comprising:

a group of nodes, wherein each of the nodes of the group of nodes comprises a set of first values; and a processor included to perform a global integer combine operation using the first values of the group of nodes, the global integer combine operation performed over the global free network to obtain a global data value.

40. The system according to claim 39, wherein the processor includes means for using results of the global integer combine operation to identify a characteristic of the first values.

41. A method of operating a parallel processing computer system including a multitude of nodes interconnected by a global interconnect structure comprising both a global free network, and a torus network, the method comprising:

performing defined operations facilitated by the dual global free network and torus network global interconnect structure; and implementing said defined operations using both the torus and tree networks in a cooperating parallel effort to obtain a global data value.

42. The method according to claim 41, wherein the parallel processing computer system includes a first and a second processor, and wherein the step of implementing includes executing torus network related functions by either of the first and second processors, and executing tree network related functions by the other of the first and second processors.

43. The method according to claim 41, wherein the step of implementing said defined operations using both the torus and free networks further includes arranging the torus communications in a three-dimensional torus, and so that no node on the torus network receives more than two packets to combine.

44. A program storage device readable by machine, tangibly embodying a program of instructions executable by the machine, that when executed by the machine perform method steps for operating a parallel processing computer system, the system comprising a multitude of machines for executing said program, and wherein said computer system comprises a multitude of nodes interconnected in a global network interconnect structure that comprises both a global free network and a torus network, the method steps comprising:

performing defined operations facilitated by the dual global free network and torus network interconnect structure to obtain a global data value; and implementing said defined operations using both the torus and free networks to cooperate on reduction operations.

45. The program storage device according to claim 44, wherein the step of implementing using both the torus and tree networks includes controlling a first processor included in the system to execute torus network operations and control a second processor included in the system to execute free network operations.

46. The program storage device according to claim 44, wherein the step of implementing both the torus and tree networks includes arranging the torus network communications in a three-dimensional torus in order that no node comprising the torus network receives more than two packets to combine.

47. A parallel processing computer system comprising:
a multitude of nodes;
a global tree network interconnecting the nodes;

a torus network also interconnecting the nodes; and control means for controlling both the torus and tree networks to cooperate in carrying out system processing operations globally, and in parallel, for reduced processing by leveraging the dual network interconnecting.

48. The computer system according to claim 47, further including two processors, wherein the control means controls one of the two processors to execute the torus network operations and control the other of the two processors to execute the free network operations.

49. A computer system according to claim 47, wherein the means for using both the torus and tree networks includes means for arranging the torus communications so that, is a three-dimensional torus, no node on the torus receives more than two packets of communications to combine.

* * * * *